(12) United States Patent
Lu et al.

(10) Patent No.: US 8,445,363 B2
(45) Date of Patent: May 21, 2013

(54) METHOD OF FABRICATING AN EPITAXIAL LAYER

(75) Inventors: Tsuo-Wen Lu, Kaohsiung (TW);
I-Ming Lai, Kaohsiung (TW);
Tsung-Yu Hou, Tainan (TW);
Chien-Liang Lin, Taoyuan County (TW); Wen-Yi Teng, Kaohsiung (TW);
Shao-Wei Wang, Taichung (TW);
Yu-Ren Wang, Tainan (TW);
Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 169 days.

(21) Appl. No.: 13/091,153

(22) Filed: Apr. 21, 2011

(65) Prior Publication Data

US 2012/0270382 A1    Oct. 25, 2012

(51) Int. Cl.
*H01L 21/20*    (2006.01)

(52) U.S. Cl.
USPC ....... 438/478; 438/503; 438/758; 257/E21.09

(58) Field of Classification Search
USPC ............. 438/429, 478, 492, 503; 257/E21.09
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,355,533 B2 | 3/2002 | Lee | |
| 6,365,476 B1 | 4/2002 | Talwar | |
| 6,368,926 B1 | 4/2002 | Wu | |
| 6,444,591 B1 | 9/2002 | Schuegraf | |
| 6,537,370 B1 | 3/2003 | Hernandez | |
| 6,544,822 B2 | 4/2003 | Kim | |
| 6,605,498 B1 | 8/2003 | Murthy | |
| 6,613,695 B2 | 9/2003 | Pomarede | |
| 6,621,131 B2 | 9/2003 | Murthy | |
| 6,624,068 B2 | 9/2003 | Thakar | |

(Continued)

*Primary Examiner* — Angel Roman

(74) *Attorney, Agent, or Firm* — Winston Hsu; Scott Margo

(57) ABSTRACT

A method of fabricating an epitaxial layer includes providing a substrate. The substrate is etched to form at least a recess within the substrate. A surface treatment is performed on the recess to form a Si—OH containing surface. An in-situ epitaxial process is performed to form an epitaxial layer within the recess, wherein the epitaxial process is performed in a hydrogen-free atmosphere and at a temperature lower than 800° C.

17 Claims, 6 Drawing Sheets

U.S. PATENT DOCUMENTS

| | | |
|---|---|---|
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov, V. |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2007/0281436 A1* | 12/2007 | Sadaka et al. ................ 438/400 |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0099785 A1* | 5/2008 | Bai et al. ...................... 257/190 |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2010/0258809 A1* | 10/2010 | Muller ........................ 257/66 |
| 2012/0052644 A1 | 3/2012 | Lu |
| 2012/0264267 A1 | 10/2012 | Lu |

* cited by examiner

METHOD OF FABRICATING AN EPITAXIAL LAYER

BACKGROUND OF THE INVENTION

1. Field of the Invention

The present invention relates generally to a method of fabricating an epitaxial layer, and more specifically, to a method of fabricating an epitaxial layer performed in a hydrogen-free atmosphere and at a temperature lower than 800° C. thereby making the interface between the epitaxial layer and the substrate have a square shape.

2. Description of the Prior Art

As known in the art, strained silicon technologies have been introduced in the MOS manufacturing process in order to increase the mobility of electrons or holes, thereby attaining higher performance of a semiconductor device. For example, taking advantage of the lattice constant of a SiGe layer being different from that of Si, a strain occurs in the silicon layer growing on the SiGe layer. Since SiGe has a larger lattice constant than Si, the band structure of Si is altered, thereby increasing the mobility of the carriers.

FIG. 1 schematically depicts a cross-sectional view of a conventional MOS transistor using epitaxial technologies. As shown in FIG. 1, the steps of fabricating the MOS transistor 100 include forming a gate structure 120 on the substrate 110, wherein the gate structure 120 includes a gate dielectric layer 122, a gate electrode 124 and a cap layer 126. A spacer 130 is formed on the sides of the gate structure 120, wherein the spacer 130 is a single layer structure or multi-layer structure composed of silicon nitride or silicon oxide, but is not limited thereto. Automatically aligning and etching a recess 140 is performed by using the spacer 130 and the gate structure 120 as hard masks. A 800° C. pre-baking process accompanied with hydrogen imported is preformed to clean the surface of the recess 140. A process such as a Si seed layer deposition process, a Si epitaxial growth process, a Si cap layer process, etc. is performed to form an epitaxial layer 150 in the recess 140. Otherwise, a trench isolation structure 10 is formed surrounding the MOS transistor 100 to electrically isolate each MOS transistors.

In modern processes, a precursor of chlorine containing gases such as hexachlorodisilane (HCD) is imported as the spacer 130 is formed, thereby allowing chlorine to attach on the surface of the spacer 130 and the recess 140. And then, the interface between the epitaxial layer 150 and the substrate 110 is passivated into an arc shape as the 800° C. pre-baking process accompanied with hydrogen imported is performed. As a result, rounding makes the width of SiGe to gate reduction leading to higher stress on channel by SiGe layer 150. However, it's hard to control the level of rounding shape which causes the instability of electrical performance of MOS transistor 100.

SUMMARY OF THE INVENTION

The purpose of the present invention is to provide a method of fabricating an epitaxial layer to form an epitaxial layer, wherein the interface between the substrate and epitaxial layer has a square shape.

According to a preferred embodiment of the present invention, a method of fabricating an epitaxial layer includes providing a substrate. The substrate is etched to form at least a recess within the substrate. A surface treatment is performed on the recess to form a Si—OH containing surface. An in-situ epitaxial process is performed to form an epitaxial layer within the recess, wherein the epitaxial process is performed in a hydrogen-free atmosphere and at a temperature lower than 800° C.

According to the above, the present invention provides a method of fabricating an epitaxial layer including performing a surface treatment on a recess to form a Si—OH containing surface. An in-situ epitaxial process is performed to form an epitaxial layer within the recess, wherein the in-situ epitaxial process is performed in a hydrogen-free atmosphere and at a temperature lower than 800° C. Therefore, the interface between the epitaxial layer formed by said method and the substrate has a square shape, thereby solving the problem of the interface passivation between the epitaxial layer and the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
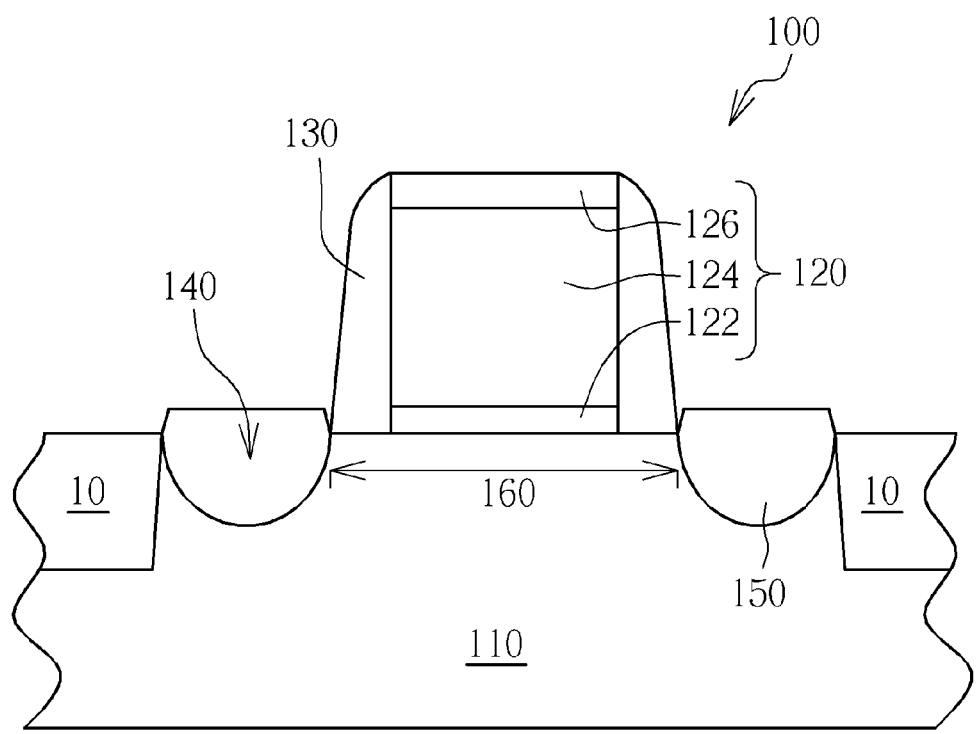
FIG. 1 schematically depicts a cross-sectional view of a conventional MOS transistor using epitaxial technologies.
Figure 2:
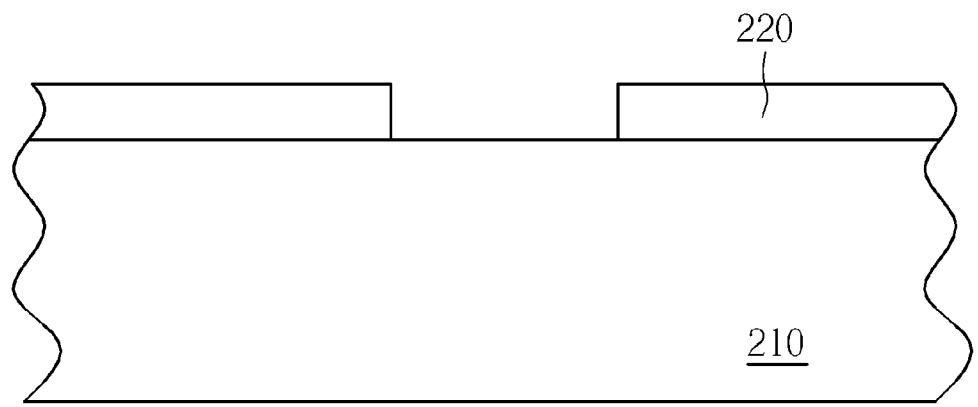
FIG. 2-4 schematically depicts a method of fabricating an epitaxial layer according to one preferred embodiment of the present invention.
Figure 3:
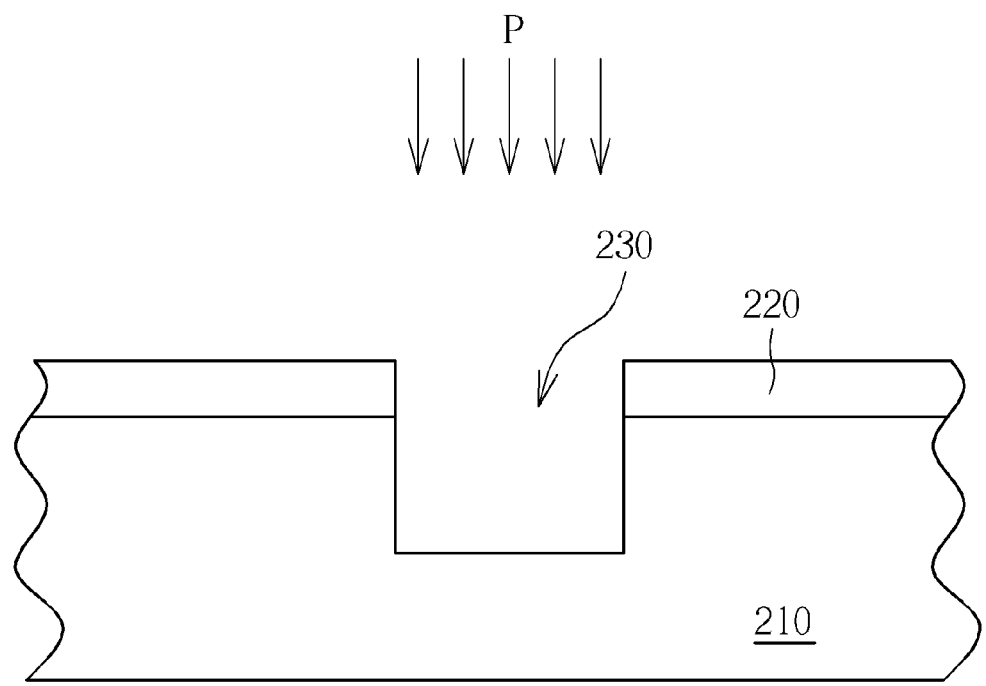
Figure 4:
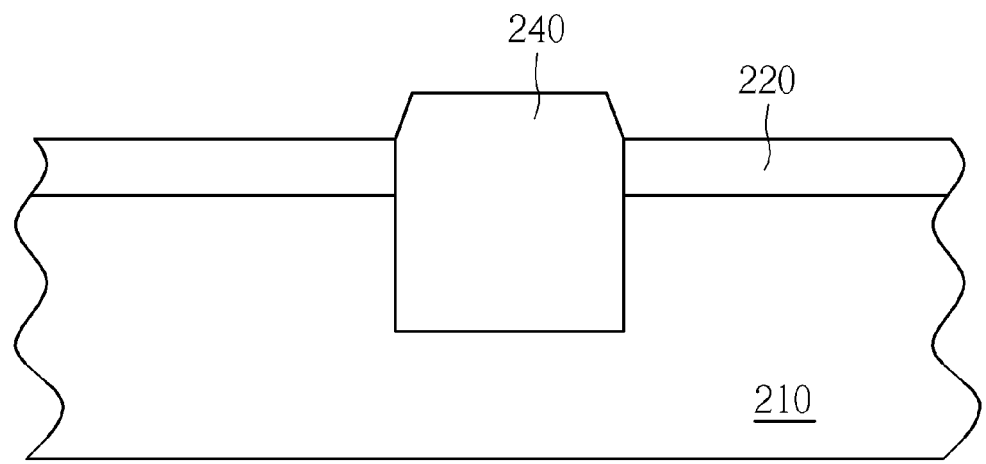

FIGS. 2-4 schematically depicts a method of fabricating an epitaxial layer according to one preferred embodiment of the present invention. Refer to FIGS. 2-4, a substrate 210 is provided, wherein the substrate 210 includes a semiconductor substrate such as a silicon substrate, a silicon containing substrate, or a silicon-on-insulator (SOI) substrate. A patterned mask 220 is formed on the substrate 210 (As shown in FIG. 2). In this embodiment, the mask 220 may be a silicon nitride layer, and more specifically may be a silicon nitride layer formed by a precursor of hexachlorodisilane (HCD). The mask 220 may be patterned by methods such as etching lithography method, but it is not limited thereto. In another embodiment, the mask 220 may be also made of other materials, and the mask 220 may be formed by a precursor of chlorine containing material or formed by chlorine containing materials, thereby forming the surface of the substrate 210 being attached with chlorine and a chlorine containing substrate. The substrate 210 is automatically aligned and etched by using the mask 220 to form a recess 230. The recess 230 may be formed by methods such as dry etching method, etc. A surface treatment P is performed in the recess 230 to form a Si—OH containing surface, and more specifically to form a Si—OH rich containing surface (as shown in FIG. 3). In this embodiment, the surface treatment P includes a cleaning process for removing chlorine, native oxide, impurities, etc. in the substrate 210 and forming a Si—OH containing surface.

Thereafter, an in-situ epitaxial process is performed to form an epitaxial layer 240 within the recess 230 (as shown in FIG. 4), wherein the epitaxial process may include a silicon epitaxial process, a silicon-germanium epitaxial process or a silicon carbide epitaxial process.

It is needed to be noticed, the in-situ epitaxial process of the present invention is performed in a hydrogen-free atmosphere and at a temperature lower than 800° C. Thus, the interface between the epitaxial layer 240 and the substrate 210 can maintain a square shape even if there is chlorine in the substrate 210. That is, the in-situ epitaxial process of the invention can avoid the passivation of the interface between the epitaxial layer 240 and the substrate 210.

Figure 9:
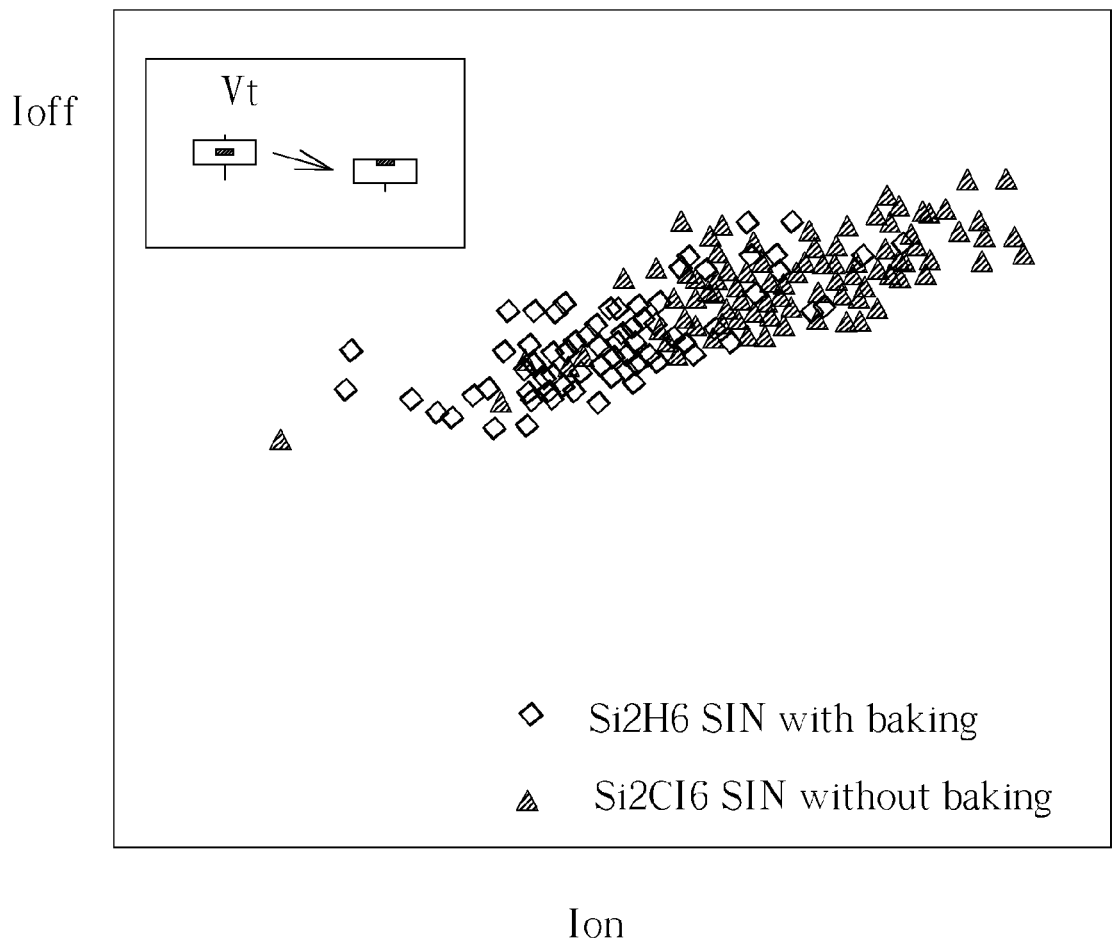
FIG. 9 schematically depicts an experimental data of a MOS transistor according to one preferred embodiment of the present invention.

In this embodiment, the pre-baking process of the prior art is eliminated in the in-situ epitaxial process for achieving the aforesaid purpose. A 800° C. pre-baking process accompanied with oxygen imported is a necessary step in modern industrial process for cleaning the recess 230. However, the pre-baking process would urge the interface between the epitaxial layer 240 and the substrate 210 being passivated into an arc shape and give rise to the bad electrical performance. Thereby, the pre-baking process is excluded in this embodiment. Besides, FIG. 9 schematically depicts an experimental data of a MOS transistor according to one preferred embodiment of the present invention. As shown in FIG. 9, the MOS transistor formed as the pre-baking process excluded has a lower threshold voltage and a higher Ion (on current) compared to the prior art, therefore having good electrical performance.

The said method of fabricating an epitaxial layer can be applied to semiconductor processes having epitaxial structure, such as a PMOS transistor or an NMOS transistor, but it is not limited thereto.

Figure 5:
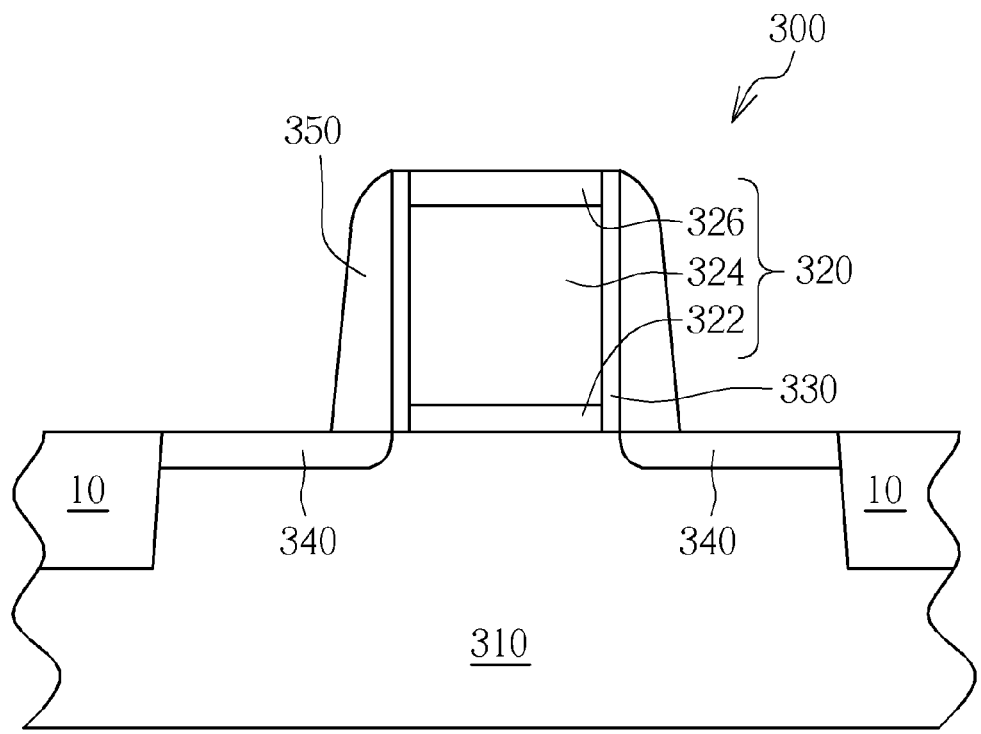
FIG. 5-7 schematically depicts a method of fabricating a MOS transistor applying the method of fabricating an epitaxial layer of the present invention according to one preferred embodiment of the present invention.
Figure 6:
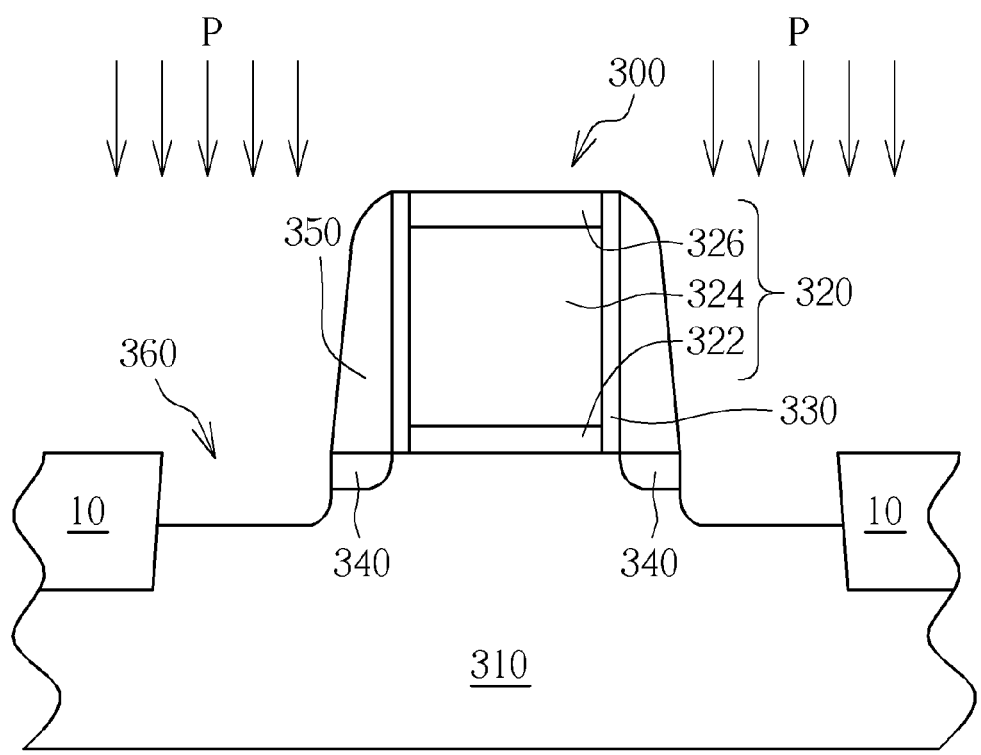
Figure 7:
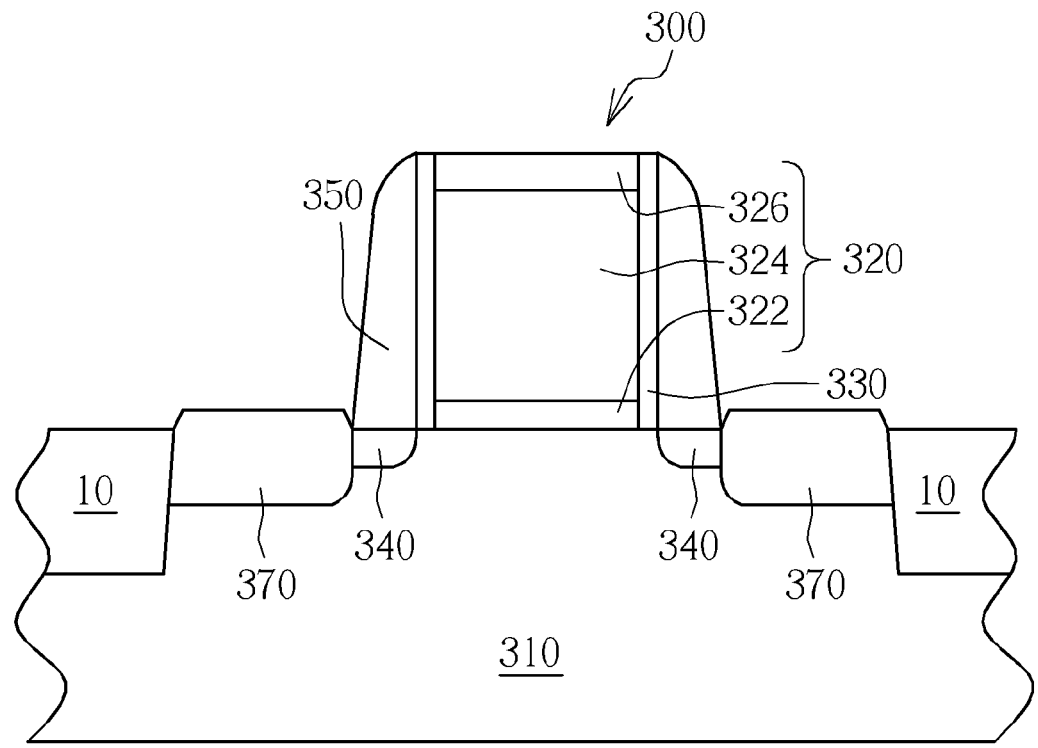

FIG. 5-7 schematically depicts a method of fabricating a MOS transistor applying the method of fabricating an epitaxial layer of the present invention according to one preferred embodiment of the present invention. Refer to FIG. 5-7, a method for fabricating a MOS transistor 300. As shown in FIG. 5, substrate 310 is provided, wherein the substrate 310 may be a semiconductor substrate such as a silicon substrate, etc. A gate structure 320 is formed on the substrate 310. The gate structure 320 may include a gate dielectric layer 322, a gate electrode 324 and a cap layer 326, wherein the materials and the fabricating methods of the gate structure 320 are known in the art so that it is not described herein.

A spacer 330 is selectively formed on the sides of the gate structure 320. A lightly doped ion implantation is performed by using the gate structure 320 and the spacer 330 as a hard mask to automatically align and define the lightly doped source/drain region 340 in the substrate 310 beside the gate structure 320, wherein the spacer 330 may be a single layer or multi-layer structure composed of a silicon nitride layer or a silicon oxide layer. A spacer 350 is formed on the sides of the gate structure 320. The spacer 350 is a silicon nitride layer, and more especially a silicon nitride layer formed by a precursor of hexachlorodisilane (HCD) in this embodiment, but the spacer 350 may be another material and the spacer 350 may be formed by a precursor of chlorine containing material or may be formed by a chlorine containing material in another embodiment, thereby forming a chlorine containing substrate because of chlorine attached on the substrate 310.

As shown in FIG. 6, the substrate 310 is automatically aligned by using the gate structure 320 and the spacer 350 as a hard mask to define and form a recess 360 in the substrate 310 beside the gate structure 320, wherein the recess 360 may be formed by etching. A surface treatment P is performed to form a Si—OH containing surface on the surface of the recess 360, wherein the Si—OH containing surface is preferred to be a Si—OH rich containing surface. In this embodiment, the surface treatment P may include a cleaning process, to remove impurities such as native oxide and form Si—OH bond in the surface of the substrate 310 at the same time.

As shown in FIG. 7, an in-situ epitaxial process is performed to form an epitaxial layer 370 in the recess 360, wherein the epitaxial layer 370 may include a silicon-germanium epitaxial layer, a silicon carbide epitaxial layer, etc., dependent on the properties of MOS transistors. The in-situ epitaxial process may include a silicon seed layer deposition process, a silicon-germanium epitaxial process, a silicon cap layer process, etc. It is needed to be noticed that the in-situ epitaxial process is performed in a hydrogen-free atmosphere and at a temperature lower than 800° C. so that the interface between the epitaxial layer 370 and the substrate 310 can maintain a square shape even if there is chlorine remained in the substrate 310. That is, the interface between the epitaxial layer 370 and the substrate 310 will not passivate into an arc shape after the epitaxial process is performed, thereby the passivation of the interface between the epitaxial layer 370 and the substrate 310 caused by chlorine containing surface and 800° C. pre-baking process is avoided. Therefore, the increasing spacing between the epitaxial layer 150 leading is avoided so that the bad electrical performance of MOS transistor 300 is avoided as well. Moreover, the necessary step of the epitaxial process in the prior art-800° C. pre-baking process accompanied with hydrogen imported is eliminated in this embodiment, to keep the epitaxial layer 370 being formed in a hydrogen-free atmosphere lower than a temperature of 800° C. but it is not limited thereto.

Finally, a spacer 350 is removed, thereby the method for fabricating the MOS transistor 300 is finished. Certainly, the epitaxial layer 370 may be formed within a doped source/drain region, being simultaneously formed with the conductive dopant in a source/drain region, or being formed after the epitaxial layer 280 is formed to form a source/drain region. Furthermore, after the epitaxial layer 370 is formed, a metal silicide may be formed on the epitaxial layer 370, or a CESL (contact etch stop layer) may be further formed on the epitaxial layer 370, which are in the scope of the present invention.

According to the above, FIGS. 5-7 illustrates a fabricating method of one MOS transistor, hence the spacer 350 formed by a precursor of hexachlorodisilane is a main spacer of the MOS transistor 300. However, in the CMOS transistor process, the hard mask formed by the precursor of hexachlorodisilane can be simultaneously applied to be a hard mask for protecting a first conductive MOS transistor from being etched and a spacer of a second conductive MOS transistor to etch a recess for silicon epitaxy.

Figure 8:
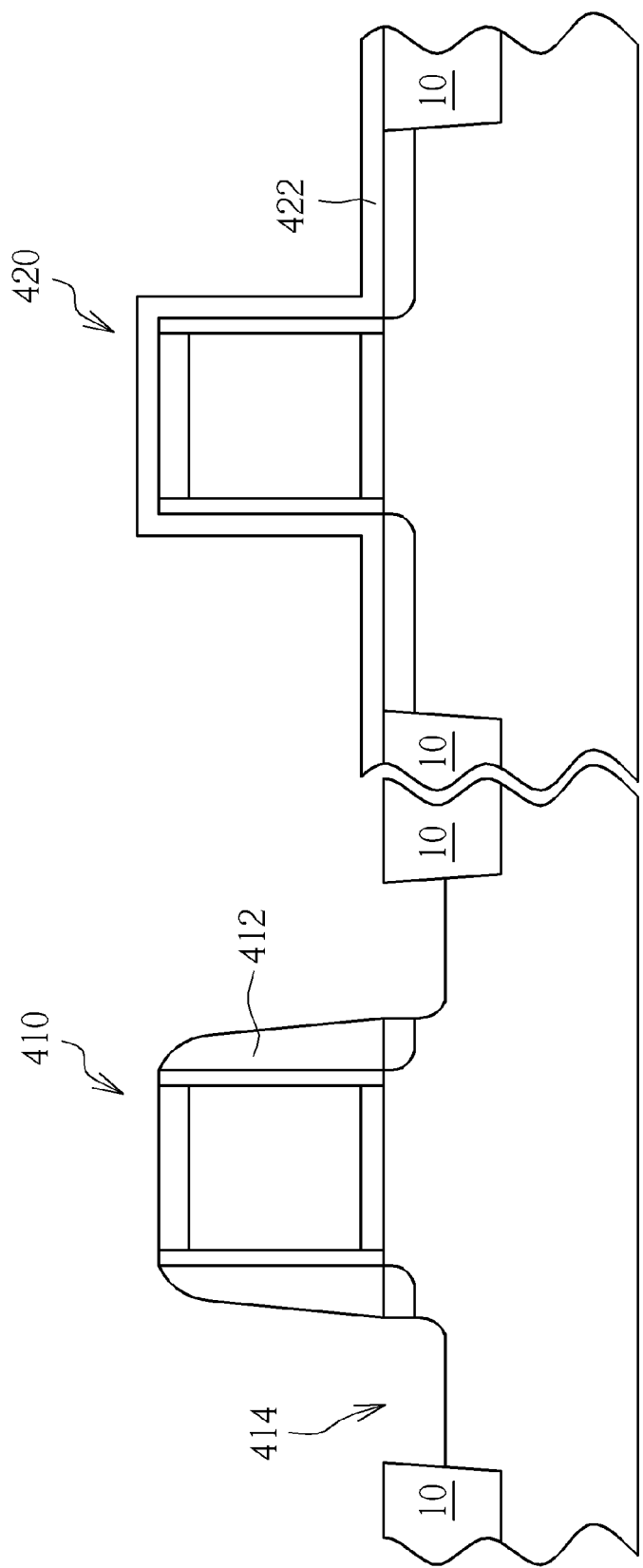
FIG. 8 schematically depicts a cross-sectional view of a CMOS transistor applying the method of fabricating an epitaxial layer of the present invention according to one preferred embodiment of the present invention.

FIG. 8 schematically depicts a cross-sectional view of a CMOS transistor applying the method of fabricating an epitaxial layer of the present invention according to one preferred embodiment of the present invention. AS shown in FIG. 8, a deposition process using hexachlorodisilane (HCD) as a precursor and a patterned process are performed to conformally cover a mask layer 422 on a second conductive type MOS transistor 420, and simultaneously form a spacer 412 by etching the mask layer (not shown) covered on the first conductive type MOS transistor 410, thereby forming a recess 414 by using the mask layer 422 and the spacer 412 as a hard mask. In one case, the second conductive type MOS transistor 420 may be an N-type MOS transistor and the first conductive type MOS transistor 410 may be a P-type MOS transistor, therefore the epitaxial layer can be a silicon-germanium (SiGe) layer. In another case, the second conductive type MOS transistor 420 may be a P-type MOS transistor and the first conductive type MOS transistor 410 may be an N-type MOS transistor, therefore the epitaxial layer can be a silicon carbide (SiC) layer. Otherwise, the mask layer 422 and the spacer 412 may include a silicon nitride layer formed by a precursor of hexachlorodisilane (HCD), but the mask layer 422 and the spacer 412 may also be other materials in another embodiment. Besides, the mask layer 422 and the spacer 412 may be formed by a precursor of chlorine containing gases or may be formed by chlorine containing processes.

Above of all, the present invention provides a method of fabricating an epitaxial layer, which can applied to semiconductor processes such as MOS transistor process, etc. The method of fabricating an epitaxial layer includes: a Si—OH containing surface is formed by performing a surface treatment on a recess and than an in-situ epitaxial process is performed to form an epitaxial layer in the recess, wherein the in-situ epitaxial process must be performed in a hydrogen-free atmosphere and at a temperature lower than 800° C. thereby giving the interface between the substrate and epitaxial layer a square shape. Therefore, the problem of the passivation of the interface between the epitaxial layer and the substrate is solved. Furthermore, an embodiment of the present invention eliminates the 800° C. pre-baking process accompanying with oxygen being imported in the prior art to maintain the interface between the epitaxial layer and the substrate as a square shape.

Those skilled in the art will readily observe that numerous modifications and alterations of the device and method may be made while retaining the teachings of the invention.

What is claimed is:

1. A method of fabricating an epitaxial layer, comprising:
   providing a substrate;
   etching the substrate to form at least a recess within the substrate;
   performing a surface treatment process on the recess to form a Si—OH containing surface;
   performing an in-situ epitaxial process to form an epitaxial layer within the recess, wherein the epitaxial process is performed in a hydrogen-free atmosphere and at a temperature lower than 800° C.

2. The method of fabricating an epitaxial layer according to claim 1, wherein the method of fabricating an epitaxial layer is suited for forming a PMOS transistor or an NMOS transistor.

3. The method of fabricating an epitaxial layer according to claim 1, wherein the epitaxial process comprises a silicon-germanium epitaxial process or a silicon-carbide epitaxial process.

4. The method of fabricating an epitaxial layer according to claim 1, wherein the substrate includes a chlorine containing substrate.

5. The method of fabricating an epitaxial layer according to claim 1, after providing the substrate, further comprising:
   forming a patterned mask on the substrate.

6. The method of fabricating an epitaxial layer according to claim 5, wherein the mask is formed by a precursor of hexachlorodisilane (HCD).

7. The method of fabricating an epitaxial layer according to claim 5, wherein the mask is formed by a precursor of chlorine containing material.

8. The method of fabricating an epitaxial layer according to claim 5, wherein the mask comprises a silicon nitride layer.

9. The method of fabricating an epitaxial layer according to claim 1, wherein the surface treatment comprises a chlorine removing process.

10. The method of fabricating an epitaxial layer according to claim 1, wherein the surface treatment comprises a cleaning process.

11. The method of fabricating an epitaxial layer according to claim 1, wherein the epitaxial process does not comprise a pre-baking process.

12. The method of fabricating an epitaxial layer according to claim 1, after providing the substrate, further comprising: forming a gate structure.

13. The method of fabricating an epitaxial layer according to claim 12, wherein the gate structure comprises a gate dielectric layer, a gate electrode, a cap layer and a spacer.

14. The method of fabricating an epitaxial layer according to claim 13, wherein the spacer comprises a precursor of hexachlorodisilane (HCD).

15. The method of fabricating an epitaxial layer according to claim 13, wherein the spacer comprises a precursor of chlorine containing material.

16. The method of fabricating an epitaxial layer according to claim 13, wherein the spacer comprises a silicon nitride layer.

17. The method of fabricating an epitaxial layer according to claim 1, wherein the interface between the epitaxial layer and the substrate has a square shape.

* * * * *